(12) United States Patent
Dennison

(10) Patent No.: US 6,882,017 B2
(45) Date of Patent: Apr. 19, 2005

(54) FIELD EFFECT TRANSISTORS AND INTEGRATED CIRCUITRY

(75) Inventor: Charles H. Dennison, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 60 days.

(21) Appl. No.: 09/730,335

(22) Filed: Dec. 4, 2000

(65) Prior Publication Data

US 2001/0001498 A1 May 24, 2001

Related U.S. Application Data

(63) Continuation of application No. 09/138,150, filed on Aug. 21, 1998, now abandoned.

(51) Int. Cl.[7] .............................................. H01L 29/76
(52) U.S. Cl. ........................ 257/413; 257/377; 257/388; 257/412
(58) Field of Search ................................. 257/377, 382, 257/384, 412, 413, 388, 767–770, 454–456, 485–486, 576, 587, 754–757

(56) References Cited

U.S. PATENT DOCUMENTS

| | | | |
|---|---|---|---|
| 4,847,111 A | 7/1989 | Chow et al. | 427/38 |
| 4,884,123 A | 11/1989 | Dixit et al. | 357/71 |
| 4,997,785 A | 3/1991 | Pfiester | 437/57 |
| 5,027,185 A | 6/1991 | Liauh | 357/59 |
| 5,083,190 A | 1/1992 | Pfiester | 357/42 |
| 5,164,333 A * | 11/1992 | Schwalke et al. | 437/200 |
| 5,244,835 A * | 9/1993 | Hachiya | 437/186 |
| 5,282,972 A | 2/1994 | Hanna et al. | 210/652 |
| 5,292,877 A | 3/1994 | Edgar et al. | 437/52 |
| 5,304,504 A | 4/1994 | Wei et al. | 437/44 |
| 5,312,768 A | 5/1994 | Gonzalez | 437/40 |
| 5,318,924 A | 6/1994 | Lin et al. | |
| 5,371,396 A * | 12/1994 | Vinal et al. | 257/412 |
| 5,418,398 A | 5/1995 | Sardella et al. | 257/755 |

(Continued)

FOREIGN PATENT DOCUMENTS

| | | |
|---|---|---|
| EP | 0 588 176 A1 | 1/1993 |
| EP | 0 722 190 A2 | 12/1995 |
| JP | 63012132 | 1/1988 |
| JP | 63012152 | 1/1988 |
| JP | 64-042857 | 2/1989 |
| JP | 64-072543 | 3/1989 |
| JP | 03-192768 | 8/1991 |
| JP | 06-204171 | 7/1994 |
| JP | 8017758 | 1/1996 |
| JP | 8279553 | 10/1996 |
| JP | 10093077 | 4/1998 |
| KR | 97-0018661 | 4/1997 |

OTHER PUBLICATIONS

Stanley Wolf, "Silicon Processing for the VLSI Era: vol. 2," Lattice Press Sunset Beach, CA. (1990) pp.273–276.

(Continued)

*Primary Examiner*—Ori Nadav
(74) *Attorney, Agent, or Firm*—Wells St. John P.S.

(57) ABSTRACT

A field effect transistor includes a pair of source/drain regions having a channel region positioned therebetween. A gate is positioned operatively proximate the channel region. The gate includes semiconductive material conductivity doped with at least one of a p-type or n-type conductivity enhancing impurity effective to render the semiconductive material electrically conductive, a silcide layer and a conductive diffusion barrier layer effective to restrict diffusion of p-type or n-type conductivity enhancing impurity. The conductive diffusion barrier layer includes $TiW_xN_y$. Integrated circuitry is also disclosed.

38 Claims, 3 Drawing Sheets

U.S. PATENT DOCUMENTS

| | | | | |
|---|---|---|---|---|
| 5,504,039 A | * | 4/1996 | Grivna | 437/195 |
| 5,510,646 A | | 4/1996 | Forouhi et al. | 257/530 |
| 5,576,579 A | | 11/1996 | Agnello et al. | 257/751 |
| 5,589,415 A | | 12/1996 | Blanchard | 437/57 |
| 5,600,165 A | | 2/1997 | Tsukamoto et al. | 257/323 |
| 5,604,140 A | | 2/1997 | Byun | 437/41 |
| 5,633,200 A | | 5/1997 | Hu | 438/653 |
| 5,637,525 A | * | 6/1997 | Dennison | 438/232 |
| 5,637,903 A | | 6/1997 | Liao et al. | 257/412 |
| 5,640,037 A | | 6/1997 | Blanchard | 257/369 |
| 5,641,708 A | | 6/1997 | Sardella et al. | 438/592 |
| 5,652,464 A | | 7/1997 | Liao et al. | |
| 5,668,037 A | | 9/1997 | Prall et al. | |
| 5,696,017 A | | 12/1997 | Ueno | |
| 5,710,454 A | * | 1/1998 | Wu | 257/413 |
| 5,718,800 A | * | 2/1998 | Juengling | 156/643.1 |
| 5,723,357 A | | 3/1998 | Huang | 437/57 |
| 5,753,528 A | | 5/1998 | Forouhi et al. | 437/60 |
| 5,770,496 A | | 6/1998 | Roberts | |
| 5,776,823 A | | 7/1998 | Agnello et al. | 438/592 |
| 5,783,850 A | | 7/1998 | Liau et al. | 257/355 |
| 5,796,166 A | | 8/1998 | Agnello et al. | 257/751 |
| 5,818,092 A | | 10/1998 | Bai et al. | 257/388 |
| 5,821,140 A | | 10/1998 | Jost et al. | 438/241 |
| 5,828,130 A | | 10/1998 | Miller et al. | 257/754 |
| 5,856,237 A | | 1/1999 | Ku | 438/683 |
| 5,883,418 A | | 3/1999 | Kimura | 257/412 |
| 5,909,637 A | * | 6/1999 | Charneski et al. | 438/687 |
| 5,910,021 A | | 6/1999 | Tabara | 438/636 |
| 5,923,999 A | | 7/1999 | Balasubramanyam et al. | |
| 5,933,741 A | | 8/1999 | Tseng | 438/305 |
| 5,969,983 A | | 10/1999 | Thakur et al. | 365/149 |
| 6,001,726 A | | 12/1999 | Nagabushnam et al. | 438/618 |
| 6,075,262 A | * | 6/2000 | Moriuchi et al. | 257/280 |
| 6,107,195 A | | 8/2000 | Gittleman et al. | 438/653 |
| 6,107,656 A | * | 8/2000 | Igarashi | 257/295 |
| 6,211,034 B1 | * | 4/2001 | Visokay et al. | 438/396 |
| 6,479,362 B1 | | 11/2002 | Cunningham | |
| 6,537,909 B1 | | 3/2003 | Lin et al. | |

OTHER PUBLICATIONS

J.D. Hayden, F.K Baker, S.A. Ernst, R.E. Jones, J. Klein, M. Lien, T.F. McNelly, T.C. Mele, H. Mendez, B–Y Nguyen, L.C. Parrillo, W. Paulson, J.R. Pfiester, F. Pintchovski, Y–C See, R. Sivan, B.M. Somero, and E.O. Travis, A High Performance Half.

"Micrometer Generation CMOS Technology for Fast SRAM's," IEEE Trans. On Electron Devices, vol. 38, No. 4, (1991) pp. 876–886

W–H. Chang, B. Davari, MR. Worderman, Y. Taur, C. Hsu, and M.D. Rodriguez, "A High Performance 0.25–$\mu$m CMOS Technology Design and Characterization," IEEE Trans. On Electron Devices, vol. 39, No. 4, (1992), pp. 959–966.

J. Nulman, B. Cohen, and K. Ngan, "Titanium Silicide and Titanium Nitride Layers Formed in an integrated Multi-chamber System", Proc. VMIC Conference (1991), pp. 312–315.

William C. O'Mara, Robert B. Herring, and Lee p. Hunt, "Handbook of Semiconductor Silicon Technology", Noyes Publ., Norwich, New York (1990), p. 684.

* cited by examiner

FIELD EFFECT TRANSISTORS AND INTEGRATED CIRCUITRY

RELATED PATENT DATA

This patent resulted from a continuation application of U.S. patent application Ser. No. 09/138,150, filed Aug. 21, 1998, now abandoned, entitled "Field Effect Transistors, Integrated Circuitry, Methods of Forming Field Effect Transistor Gates, and Methods of Forming Integrated Circuitry", naming Charles H. Dennison as inventor, the disclosure of which is incorporated by reference.

TECHNICAL FIELD

This invention relates to field effect transistors, to integrated circuitry, to methods of forming field effect transistor gates, and to methods of forming integrated circuitry.

BACKGROUND OF THE INVENTION

One aspect of semiconductor wafer processing includes making buried contacts to field effect transistor gate lines. A conventional gate line typically comprises a gate dielectric layer and a conductively doped polysilicon layer (typically n+ doped) and an overlying silicide layer (i.e., $WSi_x$). These gates are typically fabricated by deposition or provision of these three layers over a semiconductor substrate, followed by collectively patterning these layers with photoresist to form the desired is gate outlines. An insulative capping material might also be provided over the silicide layer prior to patterning to form the conductive portions of the gate line. Transistor gates might also be fabricated using damascene methods, and also above or below a thin film semiconductor layer such as in fabrication of semiconductor-on-insulator circuitry which might be top or bottom gated.

A thick insulating layer, such as borophosphosilicate glass, is typically provided over the resultant transistor and provided with an upper planar surface. Contact openings can then be etched through the insulating layer to the outer conductive portion of the transistor gates, as well as to other substrate areas. The openings are filled with conductive plugging material. Metal or conductively doped semiconductive material, such as polysilicon, are example materials.

In certain applications, it may be desirable that the conductive plugging material be a semiconductive material having opposite type conductivity enhancing dopant impurity as compared to the conductivity type impurity within the semiconductive material of the gate. For example where the gate is heavily doped to achieve conductivity with n-type material, in some applications it might be desirable to provide a conductively doped contact plug to that gate with p-type material. Unfortunately, the different dopant types can easily cross-diffuse relative to one another through the suicide which can lead to no conductive connection. One prior art solution to avoiding this diffusion is to initially line the contact opening with a very thin layer of an electrically conductive diffusion barrier material, such as TiN. Subsequently, the remaining portion of the opening is filled with conductively doped polysilicon to provide the desired electrical connection with the transistor gate.

BRIEF DESCRIPTION OF THE DRAWINGS

Preferred embodiments of the invention are described below with reference to the following accompanying drawings.

SUMMARY OF INVENTION

The invention includes field effect transistors, integrated circuitry, methods of forming field effect transistor gates, and methods of forming integrated circuitry. In one implementation, a field effect transistor includes a pair of source/drain regions having a channel region positioned therebetween. A gate is positioned operatively proximate the channel region, and includes conductively doped semiconductive material, a silicide layer and a conductive diffusion barrier layer.

In another implementation, integrated circuitry comprises a field effect transistor having a gate, a gate dielectric layer, source/drain regions and a channel region. The gate comprises semiconductive material conductively doped with a conductivity enhancing impurity of a first type and a conductive diffusion barrier layer. Insulative material is provided proximate the gate, and includes semiconductive material therein which is in electrical connection with the gate. Such semiconductive material is conductively doped with a conductivity enhancing impurity of a second type. The conductive diffusion barrier layer of the gate is provided between the gate semiconductive material and the semiconductive material provided within the insulative material.

A method of forming a field effect transistor gate includes forming a layer of conductively doped semiconductive material over a substrate, forming a layer of a conductive silicide over the substrate, and forming a conductive diffusion barrier layer over the substrate. Portions of the semiconductive material layer, the silicide layer and the conductive diffusion barrier layer are removed to form a transistor gate comprising the semiconductive material, the conductive silicide and the conductive diffusion barrier layer.

Other aspects are disclosed and claimed.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
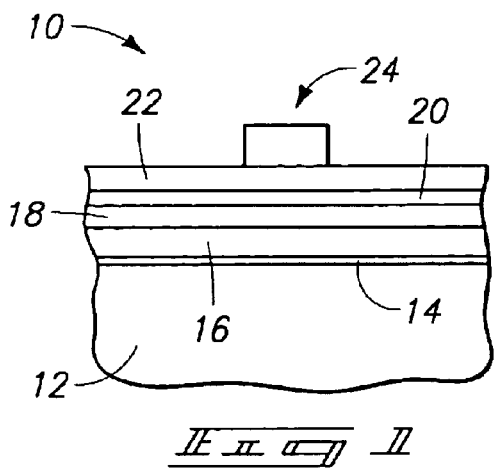
FIG. 1 is a diagrammatic sectional view of a semiconductor wafer fragment at one processing step in accordance with the invention.

The discussion initially proceeds with reference to a preferred embodiment of FIGS. 1-4. Referring to FIG. 1, a semiconductor wafer fragment 10 in one embodiment comprises a bulk monocrystalline silicon substrate 12. A gate dielectric layer 14 (i.e., thermally grown silicon dioxide having a thickness of from 50 to 90 Angstroms) is formed over substrate 12. A layer 16 of conductively doped semiconductive material Ad is formed over substrate 12 and gate dielectric layer 14, such as by chemical vapor deposition of polysilicon wherein the dopant is provided in situ. An example dopant is any suitable n-type dopant deposited to an example concentration of at least $5 \times 10^{20}$ atoms/cm$^3$. A layer 18 of a conductive silicide is formed over the substrate and doped semiconductive material layer 16. Example preferred materials are refractory metal suicides, such as WSi$_x$ and TiSi$_x$. Such can be formed by chemical vapor deposition, refractory metal layer deposition followed by a silicidation anneal, or other manner. A preferred thickness for layer 18 is from 800 to 1400 Angstroms.

A conductive diffusion barrier layer 20 is formed over the substrate and, in this example, over silicide layer 18. Example materials include titanium compounds and tungsten compounds. Preferred example materials are TiN, TiO$_x$N$_y$, W$_x$N$_y$, and TiW$_x$N$_y$, for example deposited by chemical vapor deposition to a thickness of from 100 to 300 Angstroms. Accordingly in this embodiment, the conductive diffusion barrier layer is provided over both silicide layer 18 and doped semiconductive material layer 16, and in contact with silicide layer 18. Further, conductive diffusion barrier layer 20 is not in contact with semiconductive material layer 16.

An insulative capping layer 22 is preferably formed over the conductive gate materials, with an example being SiO$_2$ or Si$_3$N$_4$ deposited to a thickness of from 1,500 to 2,500 Angstroms. A masking layer, such as deposited photoresist, is formed over the underlying layers and selectively exposed to light and developed, forming a photoresist mask 24 in the shape of a desired transistor gate line.

Figure 2:
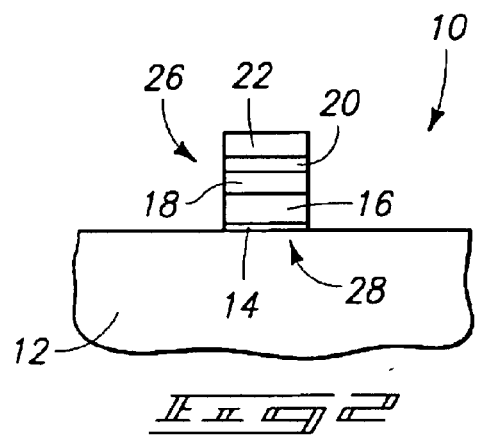
FIG. 2 is a view of the FIG. 1 wafer at a processing step subsequent to that shown by FIG. 1.

Referring to FIG. 2, portions of semiconductive material layer 16, silicide layer 18, conductive diffusion barrier layer 20 and insulating layer 22 have been removed to form a transistor gate 26 comprising the above-described conductive materials. Such removal is preferably by etching away unmasked portions by conventional etching techniques, thereby forming a transistor gate initially beneath masking layer 24. Such is shown as having been removed in FIG. 2. Gate 26 defines or is positioned over and operatively proximate a channel region 28, here formed within bulk semiconductor substrate 12.

Figure 3:
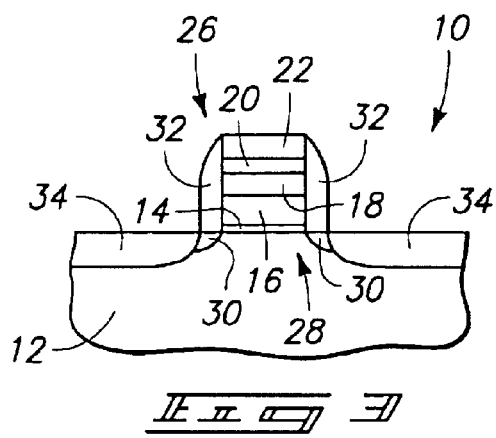
FIG. 3 is a view of the FIG. 1 wafer at a processing step subsequent to that shown by FIG. 2.

Referring to FIG. 3, lightly doped drain regions 30 are formed within bulk substrate 12 laterally outward of gate 26, followed by deposition and anisotropic etching of an insulative material to form spacers 32. A pair of source/drain regions are formed within substrate 12, with channel region 28 accordingly being positioned therebetween.

Figure 4:
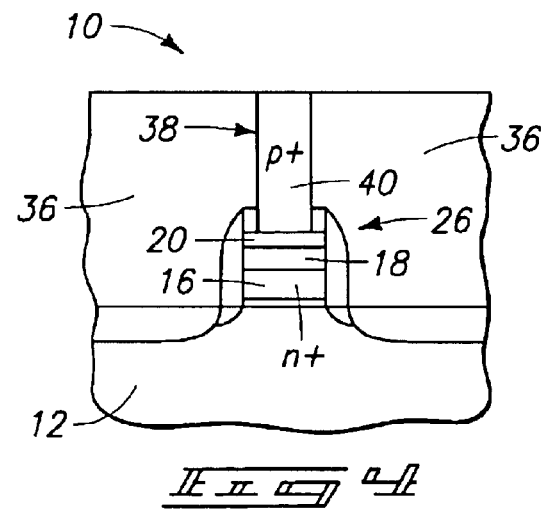
FIG. 4 is a view of the FIG. 1 wafer at a processing step subsequent to that depicted by FIG. 3.
Figure 7:
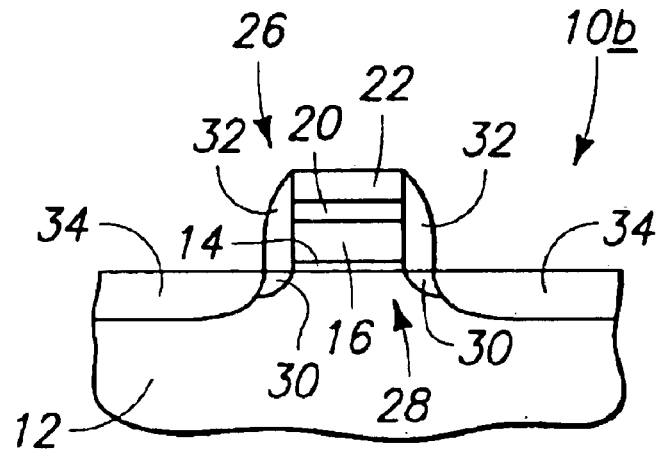
FIG. 7 is an alternate embodiment to that depicted by FIG. 3.
Figure 8:
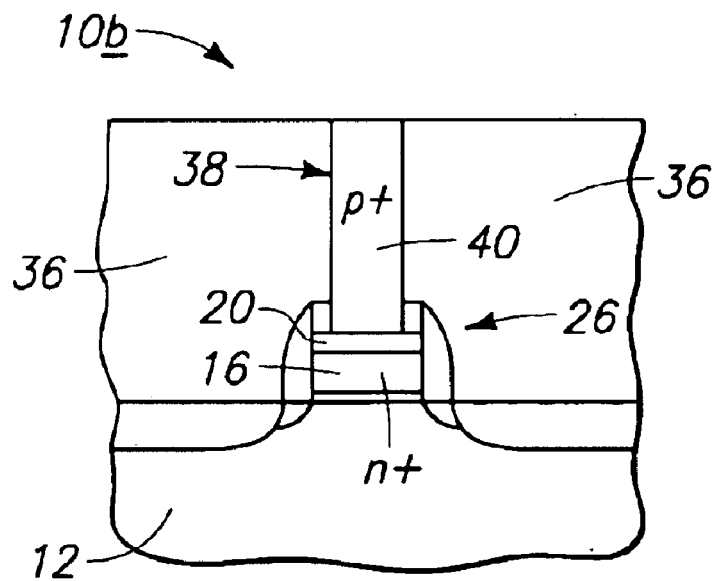
FIG. 8 is an alternate embodiment to that depicted by FIG. 4.

Referring to FIG. 4, an insulative layer 36 is formed over the substrate, with an example being borophosphosilicate glass (BPSG) deposited to a thickness of 10,000 Angstroms. Such provides but one example of providing insulative material which is received proximate gate 26. Layer 36 is preferably planarized, as shown. An opening 38 is formed into insulative layer 36, and all the way to a conductive portion of gate 26, as shown. Semiconductive material conductively doped with a conductivity enhancing impurity opposite in type to that used to dope material 16 is formed within the opening. A preferred technique is chemical vapor deposition with in situ doping, followed by planarization such as chemical-mechanical polishing to produce the illustrated plug 40 of semiconductive material within opening 38. Such provides but one example of providing conductively doped semiconductive material within electrically insulative material 36, which is proximate gate 36, and in electrical connection with gate 36. Conductive diffusion barrier layer 20 of gate 26 is accordingly received between or intermediate semiconductive material 16 of gate 26 and semiconductive material 40 within opening 38. FIG. 4 illustrates plugging material 40 as comprising p+ doped material, with the semiconductive polysilicon material of layer 16 being n+ doped. Such could of course be reversed. Alternately, the conductivity types could be the same. Further considered, silicide layer 18 might not be included in certain aspects of the invention (for example as shown in FIGS. 7 and 8 with respect to a wafer fragment 10$b$), which is intended only to be limited by the accompanying claims appropriately interpreted in accordance with the Doctrine of Equivalents. Where a silicide layer is utilized, preferably the silicide layer and conductive diffusion barrier layer comprise a common metal. For example where the silicide is WSi$_x$, a preferred barrier layer material is one or more of W$_x$N$_y$ and TiW$_x$N$_y$. Where the silicide layer is TiSi$_x$, a preferred barrier layer material is one or more of TiN, TiO$_x$N$_y$, and TiW$_x$N$_y$. The barrier layer and silicide layer are preferably deposited in the same chamber.

Figure 5:
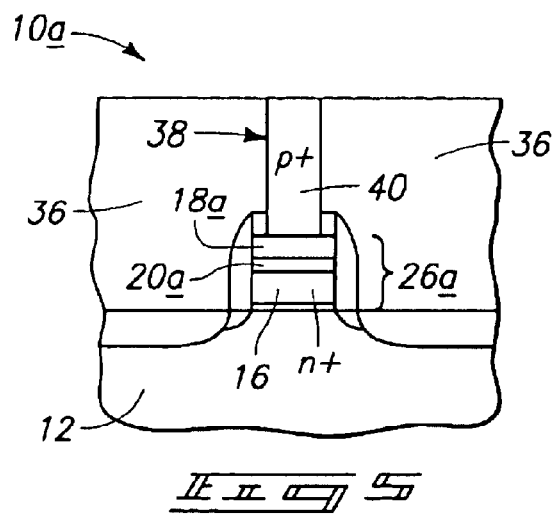
FIG. 5 is a diagrammatic sectional view of an alternate embodiment semiconductor wafer fragment to that depicted by FIG. 4.

The above-described first embodiment provides a construction whereby semiconductive material 40 within insulating material 36 contacts conductive diffusion barrier layer 20 of gate 26, but not silicide layer 18. Further, conductive diffusion barrier layer 20 is in contact with silicide layer 18 and not semiconductive material layer 16. Yet, conductive diffusion barrier layer 20 is received over both silicide layer 18 and semiconductive material layer 16. FIG. 5 illustrates but one embodiment alternate to that of FIG. 4. Like numerals from the first-described embodiment are utilized where appropriate, with differences being indicated by the suffix "a" or with different numerals. Here, conductive diffusion barrier layer 20$a$ is provided immediately over and in contact with semiconductive material 16, and silicide layer 18$a$ is provided immediately over barrier layer 20$a$. Accordingly, conductive diffusion barrier layer 20$a$ is in contact with both semiconductive material 16 and silicide layer 18$a$. Further, silicide layer 18$a$ is received over conductive diffusion barrier layer 20$a$. Further, semiconductive material 40 within insulative material 36 does not contact conductive diffusion barrier layer 20$a$ of gate 26$a$, but does contact silicide layer 18$a$. In both above-described embodiments, opening 38 within insulating material 36 is most preferably substantially or essentially void of any conductive diffusion barrier layer material, thus potentially simplifying processing for example over that disclosed above as prior art.

The above-described embodiments depict exemplary implementations 11 associated with bulk substrate processing. Processing is also contemplated in accordance with the invention with semiconductor-on-insulator layers or other layers, and with the gates and contact plugging semiconductive material being received variously or beneath such semiconductor-on-insulator layers.

Figure 6:
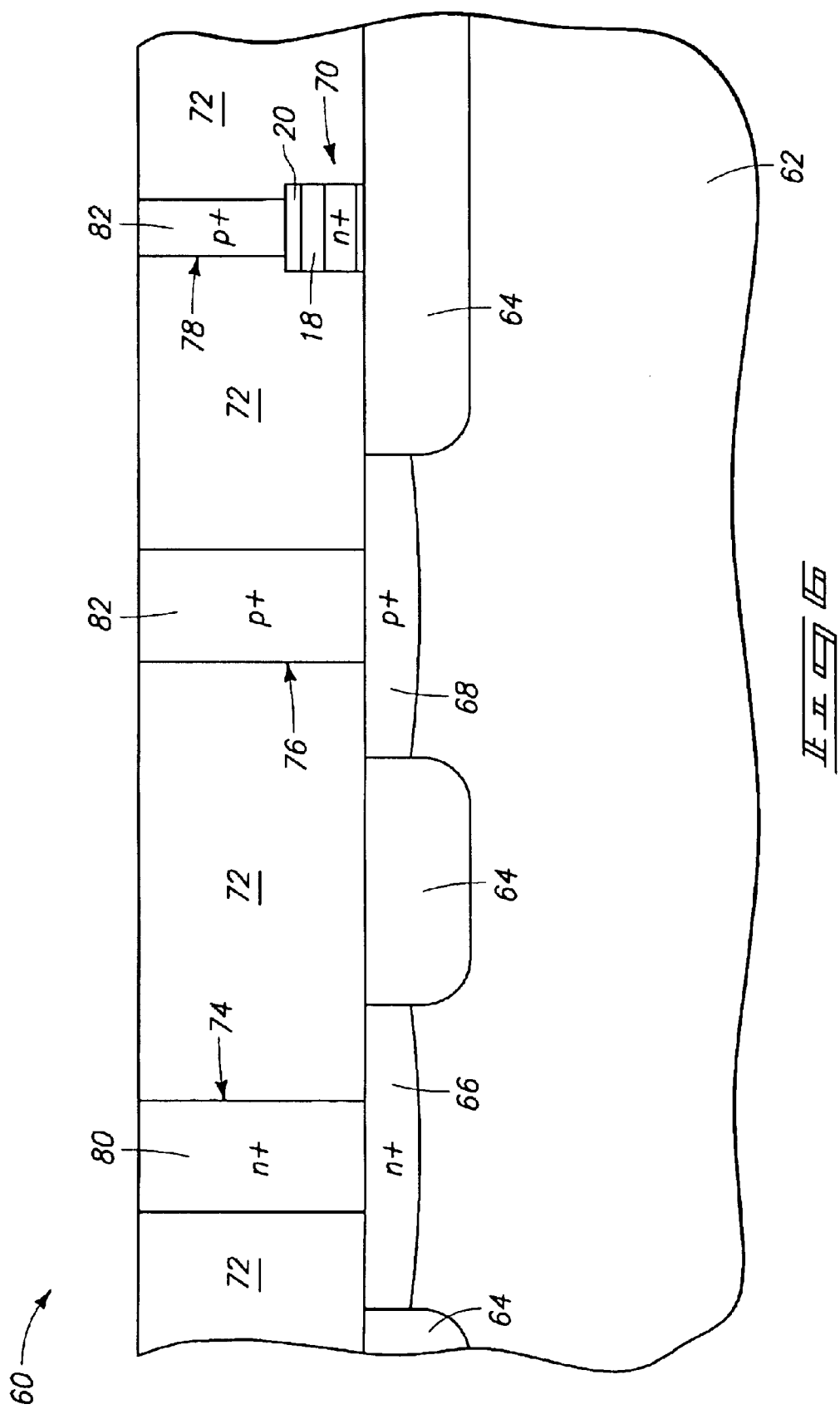
FIG. 6 is a diagrammatic sectional view of another alternate embodiment semiconductor wafer fragment in accordance with the invention.

FIG. 6 illustrates a further exemplary implementation of the invention. A semiconductor wafer fragment 60 comprises a bulk monocrystalline silicon substrate 62 having shallow trench oxide isolation regions 64 formed therein. An n+ diffusion region 66 and a p+ diffusion region 68 are formed intermediate pairs of isolation regions 64, as shown. A gate construction 70, such as a gate 26 in the above-described first embodiment, is shown provided over the far-right illustrated isolation region 64. A planarized insulating layer 72 is formed over the substrate, and includes a plurality of contact openings 74, 76, and 78 formed therein to diffusion region 66, diffusion region 68, and gate 70, respectively. Opening 74 is plugged with n+ conductively doped semiconductive material 80 for making electrical connection with n+ diffusion region 66. Openings 76 and 78 are plugged with p+ conductively doped semiconductive material 82.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A field effect transistor comprising:
   a pair of source/drain regions having a channel region positioned there between; and
   a gate positioned operatively proximate the channel region, the gate comprising semiconductive material conductively doped with at least one of a p-type or n-type conductivity enhancing impurity effective to render the semiconductive material electrically conductive, a suicide layer and a conductive diffusion barrier layer material effective to restrict diffusion of p-type or n-type conductivity enhancing impurity, the conductive diffusion barrier layer material comprising at least two of $W_xN_y$, $TiO_xN_y$ and $TiW_xN_y$.

2. The transistor of claim 1 wherein the conductive diffusion barrier layer material comprises $W_xN_y$ and $TiW_xN_y$.

3. The transistor of claim 1 wherein the conductive diffusion barrier layer material comprises $TiO_xN_y$ and $TiW_xN_y$.

4. The transistor of claim 1 wherein the conductive diffusion barrier layer material is formed over the silicide layer.

5. The transistor of claim 1 wherein the silicide layer is formed over the conductive diffusion barrier layer material.

6. The field effect transistor of claim 1 wherein the conductive diffusion barrier layer material comprises $W_xN_y$ and $TiO_xN_y$.

7. Integrated circuitry comprising:
   a substrate comprising a field effect transistor including a gate, a gate dielectric layer, source/drain regions and a channel region; the gate comprising gate semiconductive material conductively doped with a conductivity enhancing impurity of a first type and a conductive diffusion barrier layer material effective to restrict diffusion of first or second type conductivity enhancing impurity; the gate semiconductive material conductively doped with a conductivity enhancing impurity of a first type; the conductive diffusion barrier lever material, the gate dielectric layer, the source/drain regions and the channel region comprising respective cross sectional portions which are received within a common cross section: the conductive diffusion barrier layer comprising at least one of a metal and a metal compound; and
   insulative material received proximate the gate within the common cross section, a contact structure extending through the insulative material to the gate and including a portion received within the common cross section, the contact structure including semiconductive material within the common cross section provided in electrical connection with the gate, the semiconductive material provided through the insulative material within the common cross section being conductively doped with a conductivity enhancing impurity of a second type, the conductive diffusion barrier layer material of the gate within the common cross section being provided between the gate semiconductive material and the semiconductive material provided through the insulative material within the common cross section.

8. The integrated circuitry of claim 7 wherein the first type is n and the second type is p.

9. The integrated circuitry of claim 7 wherein the first type is p and the second type is n.

10. The integrated circuitry of claim 7 wherein the gate also comprises a conductive silicide.

11. The integrated circuitry of claim 10 wherein the suicide and the conductive diffusion barrier layer material comprise the same metal.

12. The integrated circuitry of claim 7 wherein the semiconductive material within the insulating material contacts the conductive diffusion barrier layer material of the gate.

13. The integrated circuitry of claim 7 wherein the semiconductive material within the insulating material does not contact the conductive diffusion barrier layer material of the gate.

14. The integrated circuitry of claim 7 wherein the gate also comprises a conductive suicide, the semiconductive material within the insulating material contacting the silicide.

15. The integrated circuitry of claim 7 wherein the conductive diffusion barrier layer material is received over the gate semiconductive material, and the semiconductive material within the insulating material is received over the gate.

16. The integrated circuitry of claim 7 wherein the insulative material comprises an opening within which the semiconductive material therein has been provided, the opening being substantially void of any conductive diffusion barrier layer material.

17. The integrated circuitry of claim 7 wherein the conductive diffusion barrier layer material comprises a material selected from the group consisting of $W_xN_y$, $TiO_xN_y$, and $TiW_xN_y$, and mixtures thereof.

18. The integrated circuitry of claim 17 wherein the conductive diffusion barrier layer material comprises $W_xN_y$.

19. The integrated circuitry of claim 17 wherein the conductive diffusion barrier layer material comprises $TiO_xN_y$.

20. The integrated circuitry of claim 17 wherein the conductive diffusion barrier layer material comprises $TiW_xN_y$.

21. The integrated circuitry of claim 10 wherein the conductive diffusion barrier layer material is formed over the silicide layer.

22. The integrated circuitry of claim 10 wherein the silicide layer is formed over the conductive diffusion barrier layer material.

23. The integrated circuitry of claim 7 wherein the gate includes opposing sidewalls in at least one cross section, the contact structure have opposing sidewalls in the one cross section, at least one of the contact structure sidewalls not aligning with either of the opposing sidewalls of the gate in the one cross section.

24. The integrated circuitry of claim 7 wherein the gate includes opposing sidewalls in at least one cross section, the contact structure have opposing sidewalls in the one cross section, neither of the contact structure sidewalls aligning with either of the opposing sidewalls of the gate in the one cross section.

25. The integrated circuitry of claim 7 wherein the conductive diffusion barrier layer material comprises at least two of $W_xN_y$, $TiO_xN_y$ and $TiW_xN_y$.

26. The integrated circuitry of claim 25 wherein the conductive diffusion barrier layer material comprises $W_xN_y$ and $TiW_xN_y$.

27. The integrated circuitry of claim 25 wherein the conductive diffusion barrier layer material comprises $TiO_xN_y$ and $TiW_xN_y$.

28. The integrated circuitry of claim 7 wherein the gate is defined by a single conductive region consisting of a) the conductively doped semiconductive material of the first type, and b) the conductive diffusion barrier layer material.

29. The integrated circuitry of claim 28 wherein the conductive diffusion barrier layer material comprises at least two of $W_xN_y$, $TiO_xN_y$ and $TiW_xN_y$.

30. The integrated circuitry of claim 28 wherein the conductive diffusion barrier layer material comprises $W_xN_y$ and $TiW_xN_y$.

31. The integrated circuitry of claim 28 wherein the conductive diffusion barrier layer material comprises $TiO_xN_y$ and $TiW_xN_y$.

32. The integrated circuitry of claim 7 wherein the gate is defined by a single conductive region consisting of a) the conductively doped semiconductive material of the first type, b) the conductive diffusion barrier layer material; and c) a conductive silicide.

33. The integrated circuitry of claim 32 wherein the conductive diffusion barrier layer material comprises at least two of $W_xN_y$, $TiO_xN_y$ and $TiW_xN_y$.

34. The integrated circuitry of claim 32 wherein the conductive diffusion barrier layer material comprises $W_xN_y$ and $TiW_xN_y$.

35. The integrated circuitry of claim 32 wherein the conductive diffusion barrier layer material comprises $TiO_xN_y$ and $TiW_xN_y$.

36. The integrated circuitry of claim 25 wherein the conductive diffusion barrier layer material comprises $W_xN_y$ and $TiO_xN_y$.

37. The integrated circuitry of claim 29 wherein the conductive diffusion barrier layer material comprises $W_xN_y$ and $TiO_xN_y$.

38. The integrated circuitry of claim 33 wherein the conductive diffusion barrier layer material comprises $W_xN_y$ and $TiO_xN_y$.

* * * * *

UNITED STATES PATENT AND TRADEMARK OFFICE
CERTIFICATE OF CORRECTION

PATENT NO. : 6,882,017 B2
DATED : April 19, 2005
INVENTOR(S) : Dennsion

It is certified that error appears in the above-identified patent and that said Letters Patent is hereby corrected as shown below:

Title page,
Item [56], References Cited, U.S. PATENT DOCUMENTS, please insert
-- 5,292,677    3/1994        Dennison -- after "5,282,972".
Item [57], ABSTRACT,
Line 4, please delete "conductivity" and insert -- conductively --.

Column 1,
Line 27, please delete "is" after "desired".
Line 53, please delete "suicide" before "which" and insert -- silicide --.

Column 3,
Line 7, please delete "suicide" after "metal" and insert -- silicide --.

Column 5,
Line 24, please delete "suicide" after "conductive, a" and insert -- silicide --.
Line 54, please delete "lever" after "barrier" and insert -- layer --.

Column 6,
Line 16, please delete "suicide" before "and the" and insert -- silicide --.
Line 16, please delete "suicide" after "conductive" and insert -- silicide --.

Signed and Sealed this

Twenty-seventh Day of September, 2005

JON W. DUDAS
*Director of the United States Patent and Trademark Office*